US012813236B2

(12) United States Patent
Posseme et al.

(10) Patent No.: US 12,813,236 B2
(45) Date of Patent: Nov. 24, 2026

(54) METHOD FOR PRODUCING AN INDIVIDUALIZATION ZONE OF AN INTEGRATED CIRCUIT

(71) Applicant: COMMISSARIAT A L'ENERGIE ATOMIQUE ET AUX ENERGIES ALTERNATIVES, Paris (FR)

(72) Inventors: Nicolas Posseme, Grenoble Cedex (FR); Stefan Landis, Grenoble Cedex (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 485 days.

(21) Appl. No.: 18/350,990

(22) Filed: Jul. 12, 2023

(65) Prior Publication Data

US 2024/0063058 A1 Feb. 22, 2024

(30) Foreign Application Priority Data

Jul. 19, 2022 (FR) ..................................... 22 07403

(51) Int. Cl.
*H10W 20/00* (2026.01)
*H10D 84/01* (2026.01)
(Continued)

(52) U.S. Cl.
CPC ...... *H10W 20/056* (2026.01); *H10D 84/0149* (2025.01); *H10D 84/038* (2025.01);
(Continued)

(58) Field of Classification Search
CPC ......... H01L 21/76877; H01L 21/76802; H01L 23/544; H01L 2223/5444; H01L 21/321;
(Continued)

(56) References Cited

U.S. PATENT DOCUMENTS

2013/0343121 A1* 12/2013 Fukutome ............ H10D 84/834 365/182
2014/0203448 A1 7/2014 Song et al.
(Continued)

FOREIGN PATENT DOCUMENTS

CN 114464617 A * 5/2022 ........... H10D 84/853

OTHER PUBLICATIONS

French Preliminary Search Report & Written Opinion issued Mar. 9, 2023 in French Application 22 07403 filed on Jul. 19, 2022, 12 pages.

(Continued)

*Primary Examiner* — Duy T Nguyen
*Assistant Examiner* — Kenneth Mark Sipling
(74) *Attorney, Agent, or Firm* — Oblon, McClelland, Maier & Neustadt, L.L.P.

(57) ABSTRACT

The invention is based on a method for producing an individualisation zone of a chip comprising a component level and a contact level comprising vias, the method comprising the following steps:

- providing the components level and a dielectric layer,
- forming a mask on the dielectric layer,
- etching the dielectric layer through mask openings so as to form openings opening onto the contact zones of the components level,
- forming fluorinated residue by inputting fluorinated species on at least some contact zones, the openings thus comprising openings with fluorinated residue and openings without residue,
- filling the openings so as to form the vias of the contact level, said vias comprising functional vias at the openings without residue and altered vias at the openings with residue.

11 Claims, 4 Drawing Sheets

(51) Int. Cl.
*H10D 84/03* (2025.01)
*H10W 46/00* (2026.01)

(52) U.S. Cl.
CPC ......... *H10W 20/081* (2026.01); *H10W 46/00* (2026.01); *H10W 46/403* (2026.01)

(58) Field of Classification Search
CPC ..... H01L 2223/54433; H01L 21/31116; H01L 23/485; H01L 23/573; H01L 23/576; H10D 84/0149; H10D 84/038; G09C 1/00; H04L 9/3278; G06F 21/73
USPC .......................................................... 438/202
See application file for complete search history.

(56) References Cited

U.S. PATENT DOCUMENTS

| | | | | |
|---|---|---|---|---|
| 2016/0020141 | A1* | 1/2016 | Posseme | H01L 21/76831 438/724 |
| 2022/0028803 | A1 | 1/2022 | Posseme et al. | |
| 2022/0051991 | A1* | 2/2022 | Hopkins | H04N 21/4222 |
| 2023/0170251 | A1 | 6/2023 | Landis et al. | |

OTHER PUBLICATIONS

Helinski, R. et al. "A Physical Unclonable Function Defined Using Power Distribution System Equivalent Resistance Variations" University of New Mexico Electrical & Computer Engineering, 2009, 26 pages.

Ju, J. et al. "Stability Analysis of a Physical Unclonable Function based on Metal Resistance Variations" University of New Mexico Electrical & Computer Engineering Dept., 2013, 8 pages.

* cited by examiner

METHOD FOR PRODUCING AN INDIVIDUALIZATION ZONE OF AN INTEGRATED CIRCUIT

TECHNICAL FIELD

The present invention relates to the individualisation of integrated circuits. It has a particularly advantageous application in protecting integrated circuits, or devices integrating such circuits.

STATE OF THE ART

The individualisation of an integrated circuit enables the unique identification of this integrated circuit. This makes it possible, for example, to protect the integrated circuit against attacks by emulating functions that the integrated circuit is supposed to do.

In order to uniquely identify an integrated circuit, there are solutions aiming to use functional dispersions inherent to integrated circuits. At the level of a transistor for example, manufactured according to the so-called FEOL (Front End Of Line) technological steps, the resistances of the metal contacts or vias differ from one circuit to another. This induces variable voltage drops and/or propagation speeds for electric signals received or emitted by these transistors. Consequently, any modification of the contact resistance at the via can be utilised to distinguish response times or voltage drops in the circuit thus produced.

Other types of functional dispersions can also be utilised, like instability upon startup of components, for example for SRAMS (Static Random Access Memory) memories, which have one single state upon each startup.

However, these solutions are very sensitive to environmental variations or to ageing. In particular, changes of temperature, supply voltages or electromagnetic interferences can affect the performances of these solutions by decreasing their robustness. Thus, the response times of an integrated circuit can develop over time. This results in a legitimate circuit optionally being able to be declared as being counterfeit.

There is therefore a need consisting of limiting, even resolving, the problems of known solutions.

SUMMARY

To achieve this aim, according to an embodiment, a method for producing an individualisation zone of a microelectronic chip is provided, said chip comprising at least:

- a components level, said components each comprising at least one metal contact zone,
- a contact level comprising vias intended to electrically connect the metal contact zones of the component level,
- the chip having at least one other zone, distinct from the individualisation zone, intended to form a functional zone of the chip.

The method comprises at least the following steps carried out at the individualisation zone of the chip:

- providing at least the components level,
- forming at least one dielectric layer on the components level, said dielectric layer being based on a dielectric material,
- forming on the at least one dielectric layer, an etching mask having mask openings located at least partially on the right of the contact zones and making the at least one dielectric layer accessible,

- etching the at least one dielectric layer through mask openings by at least one etching so as to form via openings opening onto the metal contact zones of the component level,
- forming fluorinated residue randomly distributed at certain via openings, by providing fluorinated species on at least some metal contact zones, the via openings thus comprising openings with fluorinated residue and openings without residue,
- filling the openings with an electrically conductive material so as to form at least the vias of the interconnecting level, said vias comprising functional vias at the openings without residue, and vias altered at the openings with fluorinated residue.

The method further comprises, prior to the formation of fluorinated residue in the individualisation zone, a formation of a protective mask on the zone intended to form the functional zone of the chip.

Thus, the fluorinated residue prevents the electrically conductive material from being correctly deposited in certain openings, in particular by affecting the compliance of the deposition. This fluorinated residue thus leads to the formation of defects in certain vias, at the contact zones. These vias are altered. These altered vias typically have an electrical resistance greater than that of the functional vias. The increase of electrical resistance is typically located at the contact zones, where the fluorinated residue is formed.

The proposed method therefore makes it possible to voluntarily, but randomly degrade the contact level. This voluntary degradation makes it possible to create altered or inactive vias randomly distributed within the individualisation zone of the chip. The response diagram of the chip or of the integrated circuit will therefore be closely linked to this random character. This response will consequently be unique. Each integrated circuit produced by this method thus generates a different response. Moreover, the response diagram of the integrated circuit will be stable over time, contrary to the solutions described above in the section relating to the state of the art.

The individualisation zone is difficult to physically clone, even is not physically clonable. It can be qualified by PUF (Physically Unclonable Function). It is therefore possible to make the integrated circuit comprising this individualisation zone unique.

The method according to the invention thus proposes a reliable solution, that can be easily implemented and at a reduced cost, in order to produce an individualisation zone of an integrated circuit. This thus makes it possible to individualise circuits without resorting to specific lithographic technologies to modify from one chip to another, the patterns of the individualisation zone.

The fluorinated residue is formed during the input of fluorinated species at certain contact zones. The fluor will typically react with the metal of the contact zones and the ambient humidity to form residue on the surface of the contact zones. The fluorinated residue can be fluorometallic residue.

Another aspect relates to a method for producing a microelectronic device comprising at least one integrated circuit, the integrated circuit comprising at least:

- a component level, each comprising at least one contact zone,
- a contact level comprising vias intended to electrically connect the contact zones of the component level,
- an individualisation zone of the integrated circuit.

The individualisation zone is produced by implementing the method described above, preferably only on one part of the integrated circuit.

By microelectronic device, this means any type of device produced with microelectronic means. These devices include, in particular, devices with a purely electronic purpose, micromechanical or electromechanical devices (MEMS, NEMS, etc.), as well as optical or optoelectronic devices (MOEMS, etc.). This can thus be a device intended to ensure an electronic, optical, mechanical function, etc. This can also be an intermediate product, only intended for the production of another microelectronic device.

BRIEF DESCRIPTION OF THE FIGURES

The aims, objectives, as well as the features and advantages of the invention will best emerge from the detailed description of an embodiment of the latter which is illustrated by the following accompanying drawings, wherein.

Figure 1:
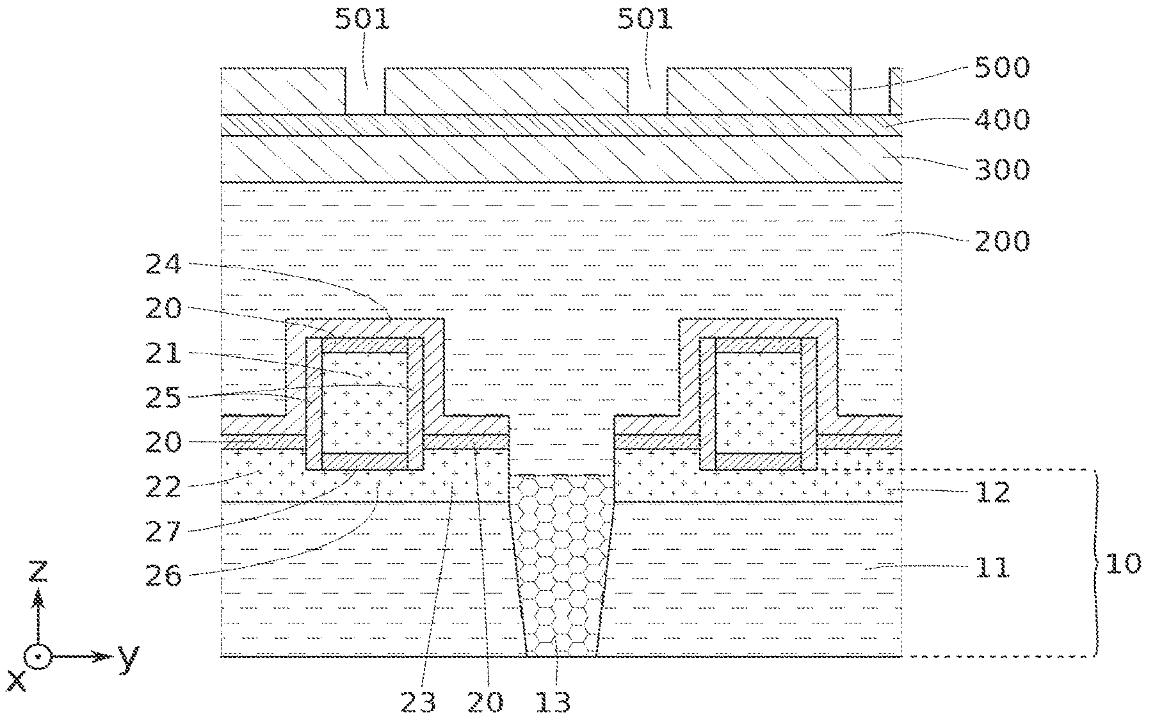
FIGS. 1 to 3 schematically illustrate, as a transverse cross-section, steps for producing a contact level for transistor-type components, according to an embodiment of the present invention.

The drawings are given as examples and are not limiting of the invention. They constitute principle schematic representations intended to facilitate the understanding of the invention and are not necessarily to the scale of practical applications. In particular, on the principle diagrams, the thicknesses of the different layers, vias, patterns and raised parts are not representative of reality.

DETAILED DESCRIPTION

Before starting a detailed review of embodiments of the invention, optional features are stated below, which can optionally be used in association or alternatively:

According to an example, the formation of fluorinated residue is done by fluorinated species-based plasma, with a zero bias voltage.

According to an example, the fluorinated species are taken from among $CF_4$, $NF_3$ or $SF_6$.

According to an example, the method further comprises a step of removing the etching mask before formation of residue.

According to an example, the etching mask is carbon-based.

According to an example, the removal of the etching mask is done by oxygen-based plasma.

According to an example, the metal contact zones are metal silicide-based.

According to an example, the fluorinated residue has an electrical resistivity greater than that of the contact zones.

According to an example, the metal contact zones are Ni-based, for example, NiPtSi.

According to an example, the at least one dielectric layer comprises a first SiN-based layer, formed directly on the contact zones and a second $SiO_2$-based layer formed on said first layer.

According to an example, the at least one etching comprises an etching of the second layer by a $CF_4/C_4F_8$-based plasma chemistry, followed by an etching of the first layer by a $CH_3F/Ar/O_2$-based plasma chemistry.

According to an example, the components are transistors and the contact zones are taken from among sources, drains, gates of said transistors.

The production of random altered or inactive vias is carried out only in the at least one individualisation zone. The integrated circuit has at least one other zone, distinct from the individualisation zone, preferably intended to form a functional zone for the integrated circuit. This other zone typically has a surface larger than the surface of the individualisation zone. In particular, the functional zone can have a surface at least twice larger than that of the individualisation zone. The component level, as well as the contact level extend into said at least one other zone. The functional zone is intended to ensure logic functions for the expected operation of the integrated circuit. The contacts and the vias of this functional zone are typically without defect. This functional zone can also comprise components, such as, for example, transistors, diodes, MEMS, etc. The functional zone is produced in a standard manner, with methods well-known to a person skilled in the art. Below, only the individualisation zone and its manufacturing method are illustrated and detailed.

In the scope of the present invention, a so-called PUF individualisation zone is fully differentiated from such a functional zone, for example, intended to perform logic operations. The individualisation zone itself mainly and preferably only has, as a function, enabling the unique identification of the chip, and therefore the authentication of the chip. To this end, and as will be detailed below, during the manufacturing method, it is provided to randomly degrade the contact level so as to obtain inactive vias. More specifically, it is provided to randomly create defects at certain vias and/or certain contact zones, so as to make these vias of the contact level inactive.

A response diagram of the integrated circuit is obtained by applying an electric or logic test routine to the inputs of the components of the individualisation zone, then by measuring the electric or logic state at the output of the components of the individualisation zone. The principle is that an individualisation zone comprising one single functional via and inactive via network is had for each integrated circuit. The response of each integrated circuit will therefore be different. Each integrated circuit can therefore be identified uniquely. The individualisation zone can be qualified as a PUF zone and the functional zone can be qualified as a non-PUF zone.

According to the invention, the response diagram of the integrated circuit depends on the number and on the position of the inactive vias in the individualisation zone.

The individualisation zone is accessible distinctly from the functional zone. The individualisation zone is located on a zone actually delimited from the chip. The individualisation zone is, for example, polygonal-shaped, for example, rectangular. Thus, any defective zone cannot be similar to a PUF individualisation zone. Likewise, any non-defective zone cannot be similar to a functional zone.

A contact level comprises conductive portions generally qualified as vias, which are intended to connect contact zones of a component. The different vias are further generally isolated from the other elements of the integrated circuit by at least one dielectric layer.

The method is typically implemented in so-called FEOL (Front End Of Line) manufacturing steps, corresponding to the production of contact levels on the single components.

In the present application, the terms "chip" and "integrated circuit" are used as synonyms.

It is specified that, in the scope of the present invention, the term "via" groups together all the electrical connections, such as conductive pads, lines and structures which extend, preferably perpendicularly, from contact zones of a component of the integrated circuit. Preferably, the vias each form a cylinder, of substantially circular cross-section.

It is specified that, in the scope of the present invention, the terms "on", "surmounts", "covers", "underlying", "vis-à-vis" and their equivalents do not necessarily mean "in contact with". Thus, for example, the deposition, the transfer, the bonding, the assembly or the application of a first layer on a second layer, does not necessarily mean that the two layers are directly in contact with one another, but means that the first layer covers at least partially the second layer, either by being directly in contact with it, or by being separated from it by at least one other layer or at least one other element.

A layer can moreover be composed of several sublayers of one same material or of different materials.

By a material A-"based" substrate, film, layer, this means a substrate, a film, a layer comprising this material A only, or this material A and optionally other materials, for example doping elements.

Several embodiments of the invention implementing successive steps of the manufacturing method are described below. Unless explicitly mentioned otherwise, the adjective "successive" does not necessarily imply, even if this is generally preferred, that the steps follow one another immediately, intermediate steps being able to separate them.

Moreover, the term "step" means the performing of one part of the method, and can mean a set of substeps.

Moreover, the term "step" does not compulsorily mean that the actions carried out during a step are simultaneous or immediately successive. Certain actions of a first step can, in particular, be followed by actions linked to a different step, and other actions of the first step can then be resumed. Thus, the term "step" does not necessarily mean single and inseparable actions over time and in the sequence of phases of the method.

The word "dielectric" qualifies a material, the electrical conductivity of which is sufficiently low in the given application to serve as an isolator. In the present invention, a dielectric material preferably has a dielectric constant less than 7.

By "selective etching vis-à-vis", or "etching having a selectivity vis-à-vis", this means an etching configured to remove a material A or a layer vis-à-vis a material B or a layer B, and having an etching speed of the material A greater than the etching speed of the material B. The selectivity is the ratio between the etching speed of the material A over the etching speed of the material B.

In the scope of the present invention, an organic or organo-mineral material which could be shaped by an exposure to an electron, photon or X-ray beam or mechanically, is qualified as a resin. These resins are typically used for lithographic steps.

Resins conventionally used in microelectronics, polystyrene (PS)-, methacrylate- (for example, polymethyl methacrylate PMMA), hydrosilsesquioxane- (HSQ), polyhydroxystyrene- (PHS)-based resins, etc. can be cited as an example. The interest in using a resin is that it is easy to deposit a thick amount of it, from several hundred nanometers to several microns.

A preferably orthonormal system, comprising the axes x, y, z is represented in the accompanying figures. When one single system is represented on one same set of figures, this system applies to all the figures of this set.

In the present patent application, thickness is preferably referred to for a layer and depth for an etching. The thickness is taken in a direction normal to the main extension plane of the layer, and the depth is taken perpendicularly to the basal plane xy of the substrate. Thus, a layer typically has a thickness along z, and an etching has a depth along z also. The relative terms "on", "surmounts", "under", "underlying" refer to positions taken along the direction z.

An element located "in vertical alignment with" or "to the right of" another element means that these two elements are both located on one same line perpendicular to a plane wherein a lower or upper face of a substrate extends, i.e. on one same line oriented vertically in the figures as a transverse cross-section.

The individualisation method is typically implemented during the formation of a contact level on a FEOL component level. This component level can, for example, comprise different types of transistors, memory elements or other microelectronic elementary devices.

FIG. 1 schematically illustrates components of the MOSFET (metal-oxide-semiconductor field-effect transistors) transistor type, with raised source drain (RSD). These transistors conventionally comprise a polycrystalline silicon-based gate 21 and a gate dielectric 27 surmounting a channel 26 formed in an active layer 12 of a substrate 10, for example of the SOI (Silicon On Insulator) type. Such an SOI substrate comprises, in a known manner, a so-called BOX (buried oxide) layer 11 interposed between a solid silicon support (which cannot be seen) and a so-called topSi active layer 12. The transistors are typically isolated from one another by isolation trenches 13.

The transistors illustrated, in this case, further comprise silicon-based raised sources 22 and drains 23, on either side of the gate 21 and separated from the gate 21 by spacers 25.

The gate 21 and the sources 22 and drains 23 comprise contact zones 20, typically forms by silicon silicidation. These contact zones 20 are preferably metallic, preferably NiPtSi-based. The contact zones 20 are intended to be connected to electric tracks by way of a contact level formed on the transistors, this contact level typically comprising contacts in the form of vias.

To form the contact level, at least one dielectric layer 200 is deposited on the transistors, then structured so as to form the contacts in the form of vias as described and illustrated below. This dielectric layer 200 has the function of electrically isolating the vias from one another. This dielectric layer 200 also has the function of forming a barrier against the diffusion of the copper. This dielectric layer 200 is, for example, $SiO_2$-based. The dielectric layer 200 can have a thickness typically of between a few hundred nanometers and a few microns, for example around 500 nm.

Prior to the deposition of the dielectric layer 200, an etching stop layer 24 is preferably compliantly deposited on the transistors of the component level. This etching stop layer 24 is thus interposed between the transistors and the dielectric layer 200. It makes it possible to control the stopping of the etching of the dielectric layer 200 during the formation of the via openings. This etching stop layer 24 is preferably silicon nitride-based, for example, SiN. The etching stop layer 24 can have a thickness typically of around a few tens of nanometers, for example around 20 nm.

The etching stop layer 24 and the dielectric layer 200 can be deposited by chemical vapour deposition (CVD), for example by plasma-enhanced chemical vapour deposition (PECVD) or by low-pressure chemical vapour deposition (LPCVD).

In order to produce the contacts through the dielectric layer 200 and the etching stop layer 24, an etching mask 300 is formed on the dielectric layer 200. It is preferably chosen from a material A having an etching selectivity which is significant vis-à-vis the dielectric material. The etching selectivity $S_{dielec:A}$ between the dielectric material and the material A is preferably greater than or equal to 10:1. This etching mask 300 is preferably of the carbon-based spin on carbon (SOC) type. The SOC-type mask 300 can have a thickness of around 150 nm.

Figure 2:
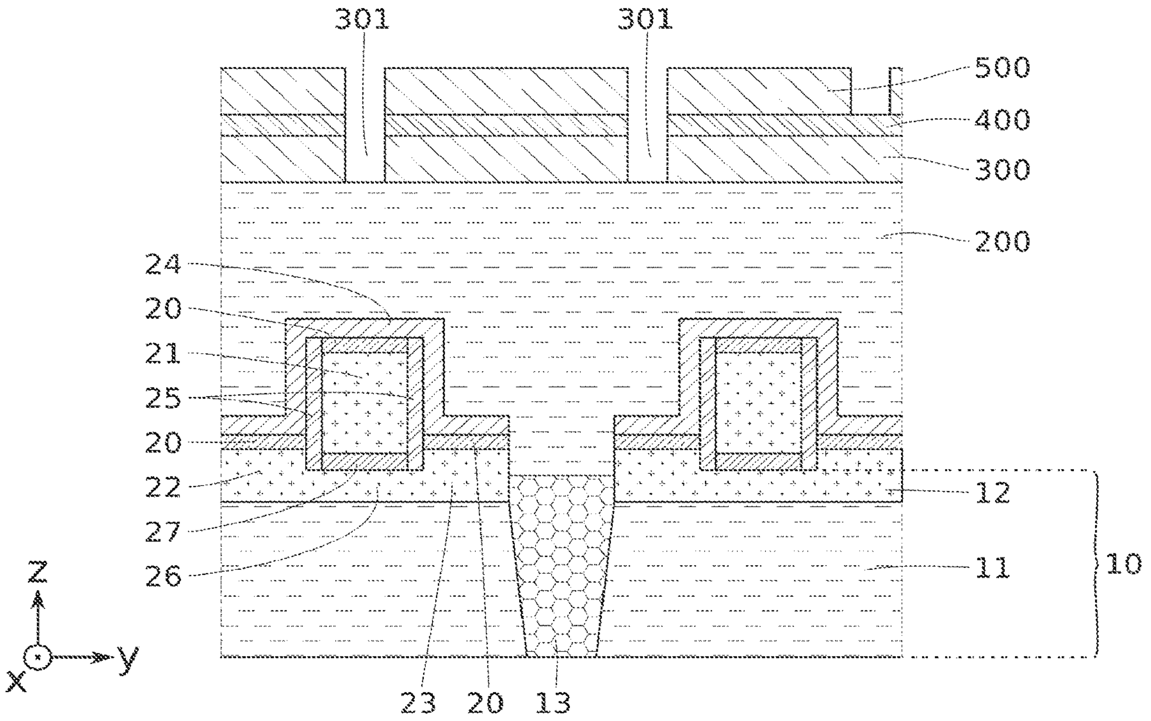

As illustrated in FIGS. 1 and 2, a resin-based mask 500 comprising openings 501 forming via patterns is deposited on the etching mask 300. These openings 501 of the mask 500 in particular serve to open the etching mask 300. The openings 501 are located at least partially to the right of the contact zones 20. The openings 501 have a lateral dimension, typically a diameter, of between a few tens of nanometers and a few hundreds of nanometers. The photosensitive resin mask 500 can have a thickness of between 50 nm and 300 nm.

An SiARC-type silicon anti-reflective coating 400 is preferably interposed between the mask 300 and the mask 500. The anti-reflective coating 400 can have a thickness between 25 nm and 35 nm, for example around 30 nm.

The thicknesses of the mask layers 300, 400, 500 can vary according to the targeted dimensions of the vias. The different mask layers 300, 400, 500 can be deposited by a conventional spin coating method.

The openings 501 of the mask 500 are made by implementing conventional lithographic techniques, such as optical lithography, electron beam (e-beam) electronic lithography, nanoprinting lithography or any other lithographic technique known to a person skilled in the art.

As illustrated in FIG. 2, an etching is done in the etching mask 300 to transfer the patterns 501 of the mask 500 there. This etching is configured to form mask openings 301. The anti-reflective coating and the etching mask 300 can be plasma etched, using a fluor-based etching chemistry, for example, $CF_4/N_2$ for the anti-reflective layer, or preferably $N_2/H_2$-based for the mask layer 300. This type of plasma makes it possible to use a thin resin-based mask 500, with a thickness, for example, less than 200 nm.

Figure 3:
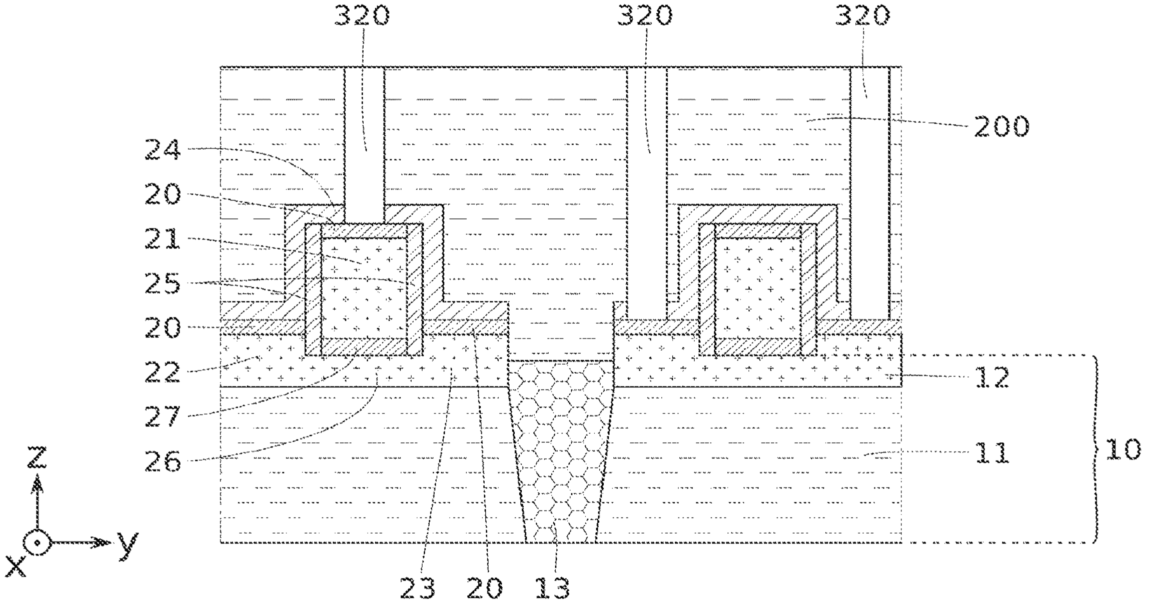

As illustrated in FIG. 3, the dielectric layer 200 is then etched through openings 301 of the etching mask 300. This etching is typically done by fluorocarbon-based plasma chemistry, for example, a $CF_4/C_4F_8/O_2$-based plasma chemistry, stopping on the nitride-based etching stop layer 24. The nitride-based etching stop layer 24 is then etched by a $CH_3F/Ar/O_2$-based plasma chemistry stopping on the silicide of the contact zones 20. This makes it possible to form via openings 320 of the contact level.

As illustrated in FIG. 3, the mask layers 300, 400, 500 are preferably removed after formation of the via openings 320. This removal can be done conventionally by a so-called "stripping" step, for example, by oxygen-based plasma. The $O_2$ stripping also makes it possible to clean the contact zones 20.

Figure 4A:
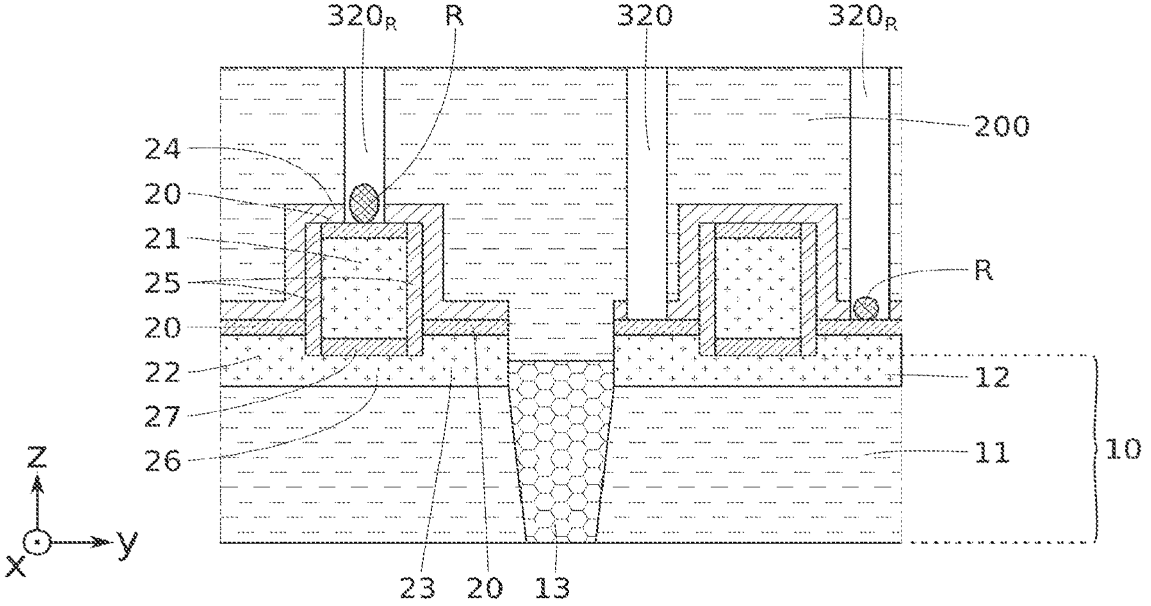
FIGS. 4A to 4C schematically illustrate respectively, as a transverse cross-section and as a top view, steps for producing an individualisation zone produced in the contact level illustrated in FIGS. 1 to 3, according to an embodiment of the present invention.
Figure 4B:
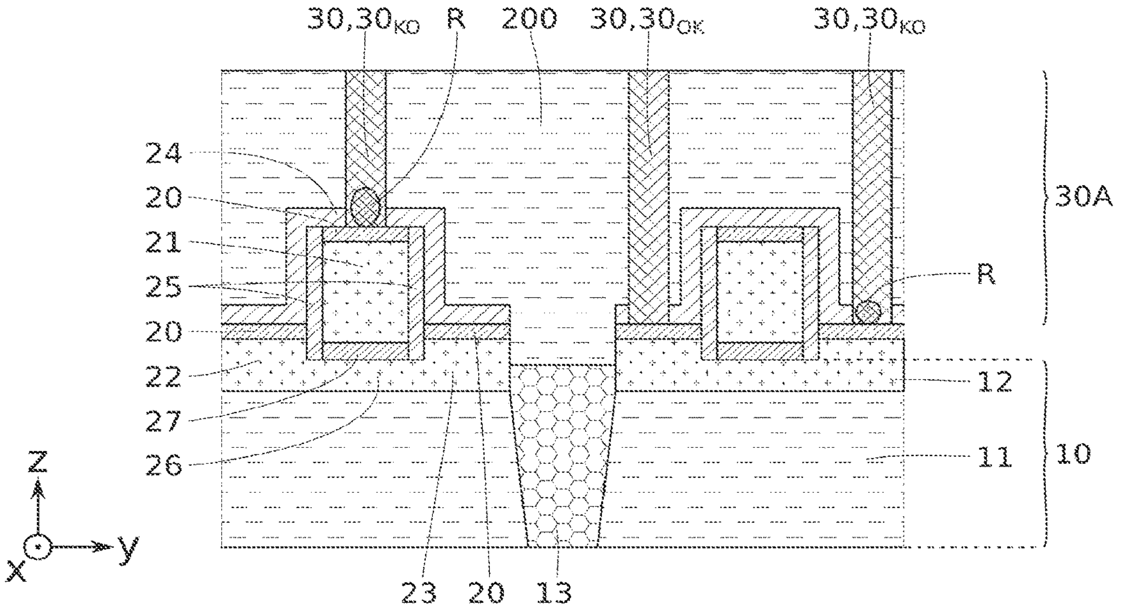
Figure 4C:
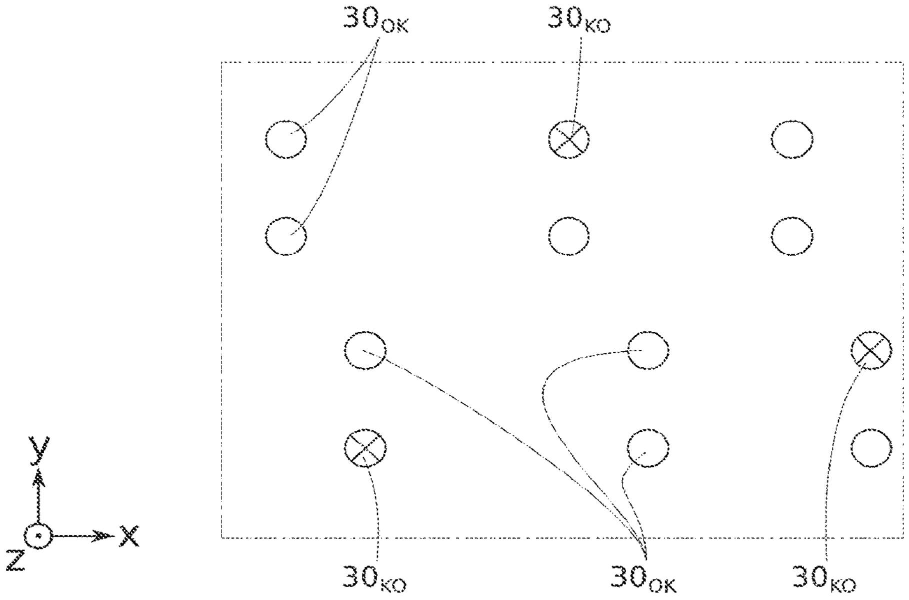
Figure 5A:
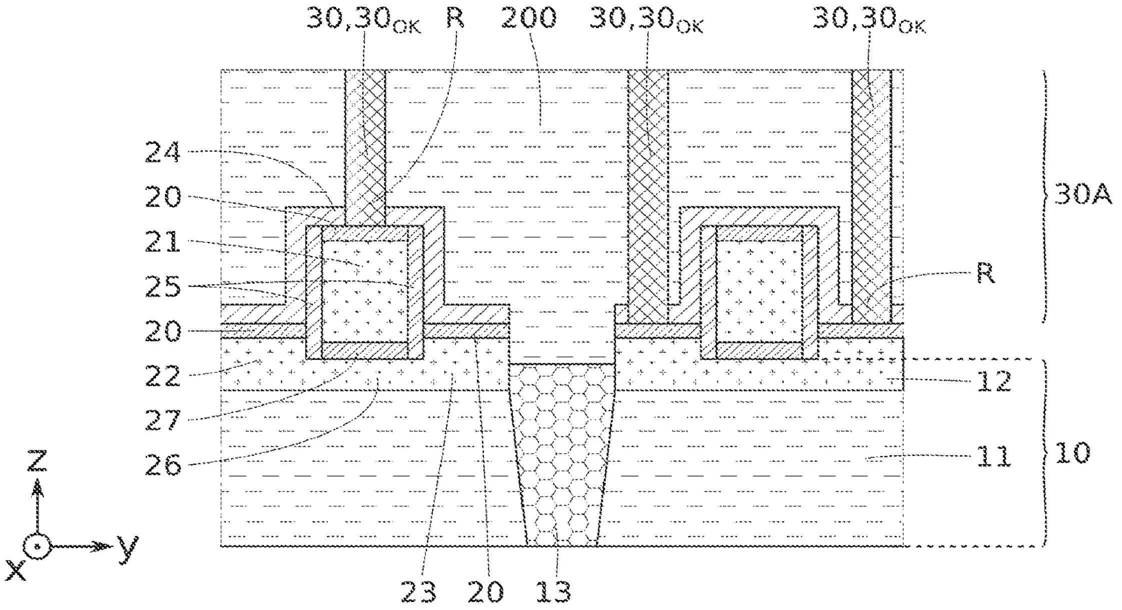
FIGS. 5A and 5B schematically illustrate respectively, as a transverse cross-section and as a top view, steps for producing a functional zone produced in the contact level illustrated in FIGS. 1 to 3, according to an embodiment of the present invention.
Figure 5B:
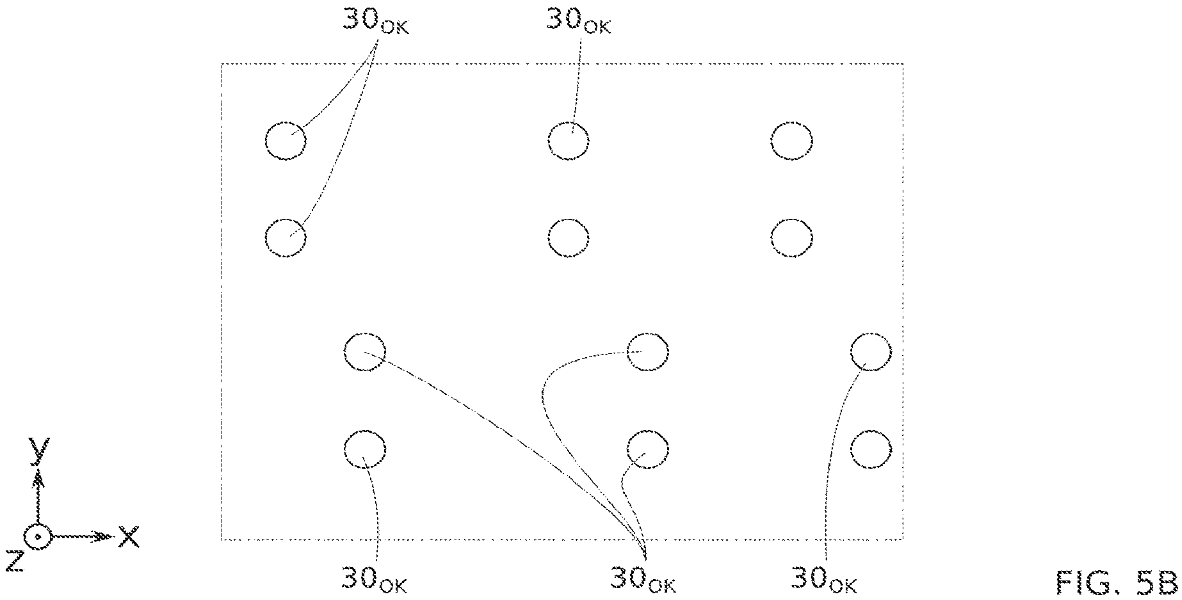

Subsequently, it is possible to proceed with the production of a so-called PUF individualisation zone, having a defectiveness in the contact level, and of a functional or "non-PUF" zone, without defectiveness and intended for the normal operation of the chip. These two zones can be located at different places of the chip, and are not necessarily in the proximity of one another. FIGS. 4A, 4B, 4C illustrate the production of a PUF zone and FIGS. 5A, 5B illustrate the production of a non-PUF zone.

As illustrated in FIG. 4A, to produce the PUF zone, according to the principle of the invention, an input of fluor is done on the surface of the NiPtSi-based contact zones 20. Thus, preferably, after the $O_2$ stripping, the contact zones 20 are typically exposed to a fluor-based, for example, $CF_4$-based, or more preferably, $SF_6$- or $NF_3$-based plasma in situ, without bias voltage. Preferably, $SF_6$ or $NF_3$ will be used by limiting the ion bombardment so as to limit the input of fluorocarbon species which could damage the NiPtSi silicide of the contact zones. This input of fluor favours the random formation of fluorinated residue R on the surface of the contact zones 20. The fluor inputted on the surface of the contact zones 20 will react with the metal of the contact zones 20, preferably NiPtSi, and with the ambient humidity to form the fluorinated residue R. The fluorinated residue R is not all the same size, nor present in all the via openings 320. After formation of the residue R, via openings 320 without residue and via openings $\mathbf{320}_R$ with residue R are thus obtained. The via openings $\mathbf{320}_R$ with residue R can be totally or partially blocked by the residue R. The distribution of the residue R is totally random.

As illustrated in FIGS. 4B, 4C, the openings 320, $\mathbf{320}_R$ are then filled by a conductive material, so as to respectively form functional vias $\mathbf{30}_{OK}$ and altered or inactive vias $\mathbf{30}_{KO}$. The functional vias $\mathbf{30}_{OK}$ and the inactive vias $\mathbf{30}_{KO}$ form the contact level 30A. The conductive material is preferably copper. The copper deposition methods, for example, an ECD (electrochemical deposition) electrolytic filling, are well-known to a person skilled in the art.

The functional vias $\mathbf{30}_{OK}$ typically have a nominal conductivity during a dedicated electric test. The inactive vias $\mathbf{30}_{KO}$ typically have a conductivity less than the nominal conductivity, even a zero conductivity, during this electric test. A certain number of vias $\mathbf{30}_{KO}$, randomly distributed, will therefore not be connected or will be incorrectly connected to the contact zones 20.

According to an option, the incorrectly connected vias $\mathbf{30}_{KO}$ can subsequently be deactivated, for example, if the stability of their electrical connection is not efficient enough. They can be used as is, by taking advantage of their greater connection resistance (the metal contact surface being lower than for a functional via $\mathbf{30}_{OK}$). This greater connection resistance in particular induces a response time different from the circuitry, for example during the electric test of the individualisation zone.

In the PUF zone, a randomly connected via network 30 is thus obtained, with totally connected vias $\mathbf{30}_{OK}$ and vias $\mathbf{30}_{KO}$ which are not connected or which are partially connected. The position of the different vias $\mathbf{30}_{OK}$, $\mathbf{30}_{KO}$ and their number varies from one PUF zone to another PUF zone, from one microelectronic chip to another microelectronic chip.

As illustrated in FIGS. 5A, 5B, in the non-PUF zone, the silicide contact zones 20 are not contaminated by fluor and the via openings 320 have no fluorinated residue, after $O_2$ stripping. According to a variant, the silicidation of the contact zones 20 can be done after opening of the etching stop layer 24. The absence of reactive silicide during the etching of the via openings makes it possible to avoid the appearance of residue.

The openings 320 of the non-PUF zone are then filled by a conductive material, preferably copper, so as to only form functional vias $\mathbf{30}_{OK}$.

In view of the description above, it clearly appears that the method proposed offers a particularly effective solution for producing a PUF-type individualisation zone having a defectiveness in the contact level, and a non-PUF zone without defectiveness and intended for the normal operation of the chip.

The invention is not limited to the embodiments described above.

The invention claimed is:

1. A method for producing an individualisation zone of a microelectronic chip, the chip comprising at least:

a component level having components each comprising at least one metal contact zone, a contact level comprising vias that electrically connect the metal contact zones of the component level to electrical tracks, the chip having at least one other zone, distinct from the individualisation zone, configured to form a functional zone of the chip, the method comprising at least the following steps carried out at the individualisation zone of the chip:

providing at least the components level, forming at least one dielectric layer on the components level, the dielectric layer being based on a dielectric material, forming on the at least one dielectric layer, an etching mask having mask openings located at least partially to the right of the metal contact zones and making the at least one dielectric layer accessible, etching the at least one dielectric layer through the mask openings by at least one etching so as to form via openings opening onto the metal contact zones of the component level, forming randomly distributed fluorinated residue at certain via openings, by inputting fluorinated species on at least some metal contact zones, the formation of fluorinated residue being done in situ, the via openings thus comprising openings with fluorinated residue and openings without residue, filling the via openings with an electrically conductive material so as to form at least the vias of the contact level, the vias comprising functional vias at the openings without residue and altered vias at the openings with fluorinated residue, the method further comprising, prior to the formation of the fluorinated residue in the individualisation zone, a formation of a protective mask on the at least one other zone configured to form the functional zone of the chip.

2. The method according to claim 1, wherein the formation of the fluorinated residue is done by fluorinated-species-based plasma, with a zero bias voltage.

3. The method according to claim 2, wherein the fluorinated species are taken from among $CF_4$, $NF_3$ or $SF_6$.

4. The method according to claim 1, further comprising a step of removing the etching mask before formation of the fluorinated residue.

5. The method according to claim 4, wherein the etching mask is carbon based.

6. The method according to claim 4 wherein the removal of the etching mask is done by oxygen-based plasma.

7. The method according to claim 1, wherein the metal contact zones are metal silicide-based, and wherein the fluorinated residue has an electrical resistivity greater than that of the contact zones.

8. The method according to claim 1, wherein the metal contact zones are Ni-based.

9. The method according to claim 1, wherein the at least one dielectric layer comprises a first SiN-based layer formed directly on the contact zones and a second $SiO_2$-based layer formed on the first layer, and wherein the at least one etching comprises an etching of the second layer by a $CF_4/C_4F_8$-based plasma chemistry, followed by an etching of the first layer by a $CF_4/C_4F_8$-based plasma chemistry.

10. The method according to claim 1, wherein the components are transistors and the contact zones are taken from among sources, drains, gates of the transistors.

11. A method for producing a microelectronic device comprising at least one integrated circuit, the integrated circuit comprising at least:

a components level having components each comprising at least one metal contact zone, a contact level comprising vias configured to electrically connect the contact zones of the component level to electrical tracks, an individualisation zone, the method for producing the microelectronic device comprising the producing of the individualisation zone by implementing at least the following steps carried out at the individualisation zone:

providing at least the components level, forming at least one dielectric layer on the components level, the dielectric layer being based on a dielectric material, forming on the at least one dielectric layer, an etching mask having mask openings located at least partially to the right of the metal contact zones and making the at least one dielectric layer accessible, etching the at least one dielectric layer through the mask openings by at least one etching so as to form via openings opening onto the metal contact zones of the component level, forming randomly distributed fluorinated residue at certain via openings, by inputting fluorinated species on at least some metal contact zones, the formation of fluorinated residue being done in situ, the via openings thus comprising openings with fluorinated residue and openings without residue, and filling the via openings with an electrically conductive material so as to form at least the vias of the contact level, the vias comprising functional vias at the openings without residue and altered vias at the openings with fluorinated residue, wherein the method further comprising, prior to the formation of the fluorinated residue in the individualisation zone, a formation of a protective mask on at least one other zone of the integrated circuit that is distinct from the individualisation zone and is configured to form a functional zone of the microelectronic device.

* * * * *